United States Patent
Wei

(10) Patent No.: US 9,446,479 B2
(45) Date of Patent: Sep. 20, 2016

(54) PROCESSING METHOD FOR PLATE-SHAPED WORKPIECE

(71) Applicant: DISCO CORPORATION, Tokyo (JP)

(72) Inventor: Frank Wei, Tokyo (JP)

(73) Assignee: Disco Corporation, Tokyo (JP)

( * ) Notice: Subject to any disclaimer, the term of this patent is extended or adjusted under 35 U.S.C. 154(b) by 333 days.

(21) Appl. No.: 14/219,669

(22) Filed: Mar. 19, 2014

(65) Prior Publication Data

US 2014/0305916 A1 Oct. 16, 2014

(30) Foreign Application Priority Data

Apr. 11, 2013 (JP) .................................. 2013-082708

(51) Int. Cl.

| | |
|---|---|
| *H01L 21/68* | (2006.01) |
| *H01L 21/78* | (2006.01) |
| *B23K 26/21* | (2014.01) |
| *B23K 26/324* | (2014.01) |
| *B23K 26/32* | (2014.01) |
| *H01L 21/683* | (2006.01) |
| *H01L 21/67* | (2006.01) |

(52) U.S. Cl.
CPC ............. *B23K 26/324* (2013.01); *B23K 26/21* (2015.10); *H01L 21/67092* (2013.01); *H01L 21/67132* (2013.01); *H01L 21/68* (2013.01); *H01L 21/6835* (2013.01); *H01L 21/78* (2013.01)

(58) Field of Classification Search
CPC ... H01L 21/68; H01L 21/6835; H01L 21/78; B23K 26/21; B23K 26/324
USPC ........ 438/460, 463, 464; 219/121.69; 216/94
See application file for complete search history.

(56) References Cited

U.S. PATENT DOCUMENTS 9,123,794 B2 * 9/2015 Amano ................... H01L 21/78

FOREIGN PATENT DOCUMENTS

| JP | 05-198542 | 8/1993 |
|---|---|---|
| JP | 2004-207606 | 7/2004 |

* cited by examiner

*Primary Examiner* — Samuel M Heinrich
(74) *Attorney, Agent, or Firm* — Greer Burns & Crain, Ltd.

(57) ABSTRACT

A method of processing a plate-shaped workpiece includes: a positioning step of mounting the plate-shaped workpiece on a support plate; a joining step of irradiating an outer peripheral portion of the plate-shaped workpiece mounted on the support plate with a laser beam to form a fusion bond region where the plate-shaped workpiece is fusion-bonded to the support plate at the outer peripheral portion of the plate-shaped workpiece, thereby fixing the plate-shaped workpiece onto the support plate; and a processing step of processing the plate-shaped workpiece after the joining step.

4 Claims, 8 Drawing Sheets

PROCESSING METHOD FOR PLATE-SHAPED WORKPIECE

BACKGROUND OF THE INVENTION

1. Field of the Invention

The present invention relates to a processing method for processing a plate-shaped workpiece such as a wafer.

2. Description of the Related Art

In processing a plate-shaped workpiece such as a semiconductor wafer or an optical device wafer, a protective tape may in some cases be used for protection of devices formed on the front surface side of the plate-shaped workpiece (refer to, for example, Japanese Patent Laid-open No. Hei 5-198542). The protective tape is composed, for example, of a base material (substrate) and a glue layer on the base material. The protective tape is adhered to the front surface side of the plate-shaped workpiece by the tackiness of the glue contained in the glue layer.

In addition, a support plate for supporting a plate-shaped workpiece may in some cases be used for preventing damages such as cracking, chipping or the like of the plate-shaped workpiece during processing (see, for example, Japanese Patent Laid-open No. 2004-207606). The support plate has rigidity necessary for supporting the plate-shaped workpiece, and is adhered onto the front surface side of the plate-shaped workpiece (the object of processing) by use of an adhesive containing a thermoplastic or thermosetting resin.

SUMMARY OF THE INVENTION

The glue layer constituting the protective tape varies in thickness in a certain degree. This leads to some problems. For example, when the front surface of the protective tape is adhered to the front surface of the plate-shaped workpiece, the thickness from the back surface of the protective tape to the back surface of the plate-shaped workpiece will be non-constant in the plane of the plate-shaped workpiece. Similarly, it is difficult to make uniform the thickness of the adhesive interposed between the support plate and the plate-shaped workpiece. When the front surface of the support plate is adhered to the front surface of the plate-shaped workpiece, therefore, the thickness from the back surface of the support plate to the back surface of the plate-shaped workpiece will not be constant in the plane of the plate-shaped workpiece.

If the thickness from the back surface of the protective tape or of the support plate to the back surface of the plate-shaped workpiece (the surface as the object of processing) is non-constant in the plane of the plate-shaped workpiece, the height position of the back surface of the plate-shaped workpiece in the state of being held by holding means of a processing apparatus would be scattered. When the plate-shaped workpiece is ground in the condition where the height position of its back surface as the object of processing is thus scattered, there would arise the problem that it is impossible to obtain a uniform finished thickness of the plate-shaped workpiece.

Besides, in removal of the protective tape or the support plate from the plate-shaped workpiece after processing, the glue or the adhesive may be partly left on the plate-shaped workpiece. Especially, in the case of adhering the protective tape or the support plate to the front surface side where the devices are formed, the glue or the adhesive may be left on the minute ruggedness attributable to the devices, possibly causing defects in the devices.

In view of the foregoing, it is an object of the present invention to provide a method of processing a plate-shaped workpiece by which it is possible to restrain the height position of a surface as the object of processing from scattering and to prevent a glue or adhesive from being left on the plate-shaped workpiece after processing.

In accordance with an aspect of the present invention, there is provided a method of processing a plate-shaped workpiece, including: a positioning step of mounting the plate-shaped workpiece on a support plate; a joining step of irradiating an outer peripheral portion of the plate-shaped workpiece mounted on the support plate with a laser beam to form a fusion bond region where the plate-shaped workpiece is fusion-bonded to the support plate at the outer peripheral portion of the plate-shaped workpiece, thereby fixing the plate-shaped workpiece onto the support plate; and a processing step of processing the plate-shaped workpiece after the joining step.

In the processing method, it is preferable that the method further includes a detaching step of forming, after the processing step, a splitting groove for splitting the plate-shaped workpiece along the fusion bond region, and detaching the plate-shaped workpiece from the support plate, and that in the detaching step, the splitting groove is formed so that an inner circumference of the splitting groove is located on the side of a center of the plate-shaped workpiece relative to the position of an inner circumference of the fusion bond region.

According to the present invention, an outer peripheral portion of the plate-shaped workpiece mounted on the support plate is irradiated with a laser beam to form the fusion bond region where the plate-shaped workpiece is fusion-bonded to the support plate, so that the plate-shaped workpiece can be fixed onto the support plate without using any glue layer or adhesive. Therefore, the height position of the surface as the object of processing can be restrained from being scattered due to the use of a glue layer or adhesive. In addition, remaining of a glue or adhesive on the plate-shaped workpiece after processing can be obviated.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Now, a mode for carrying out the present invention will be described below referring to the attached drawings. In the mode as follows, a processing method wherein the object of processing is a wafer formed with devices on the front surface side thereof will be described. However, the plate-shaped workpiece as the object of processing by the processing method according to the present invention is not limited to such a wafer. A wafer before formed thereon with devices, and the like may also be adopted as the object to be processed by the processing method of the present invention.

Figure 3:
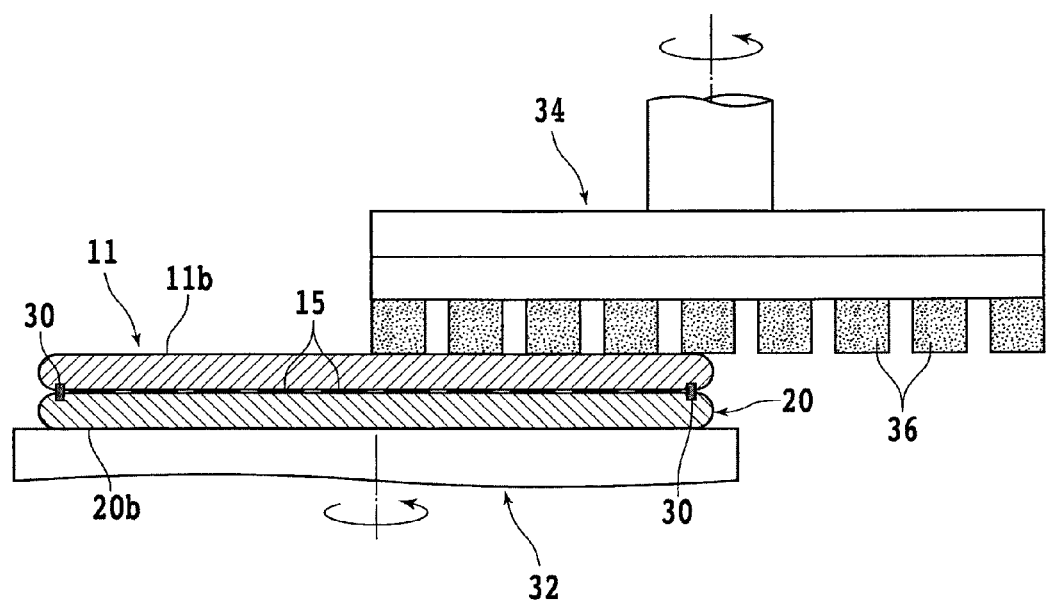
FIG. 3 is a partly sectional side view showing schematically a processing step.
Figure 4A:
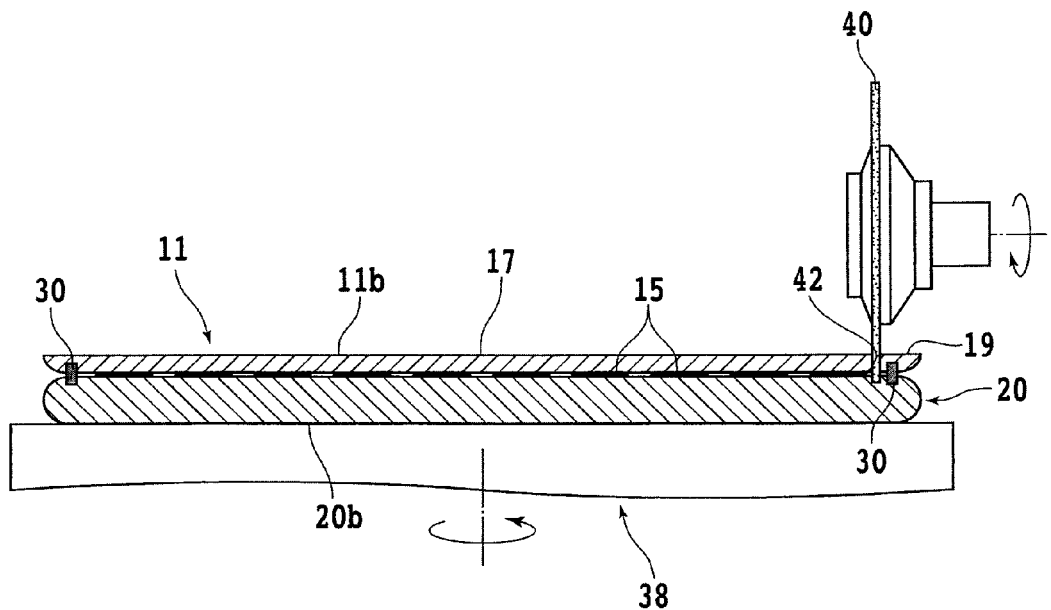
FIGS. 4A and 4B are partly sectional side views showing schematically a first embodiment of a detaching step.
Figure 4B:
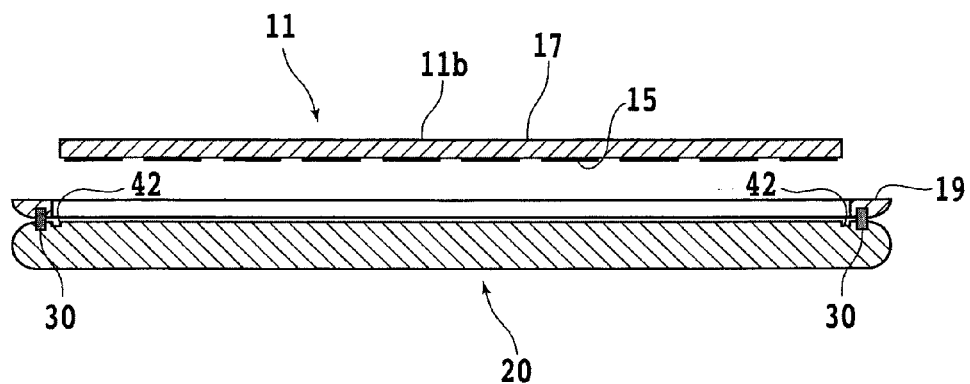

The method of processing a plate-shaped workpiece according to the mode for carrying out the present invention includes a positioning step (see FIGS. 1A and 1B), a joining step (see FIGS. 2A to 2C), a processing step (see FIG. 3), and a detaching step (see FIGS. 4A and 4B). In the positioning step, a wafer (plate-shaped workpiece) 11 as an object of processing is positioned relative to a support plate 20, and the wafer 11 is mounted on the support plate 20 (see FIGS. 1A and 1B). In the joining step, an outer peripheral marginal region (outer peripheral portion) 19 of the wafer 11 is irradiated with a laser beam 26, to fusion-bond the wafer 11 and the support plate 20 to each other, thereby fixing the wafer 11 onto the support plate 20 (see FIGS. 2A to 2C). In the processing step, the wafer 11 fixed onto the support plate 20 is processed (see FIG. 3). In the detaching step, the wafer 11 fixed on the support plate 20 is split, and is detached from the support plate 20 (see FIGS. 4A and 4B). Now, each of the steps in the processing method according to the mode for carrying out the present invention will be described in detail below.

Figure 1A:
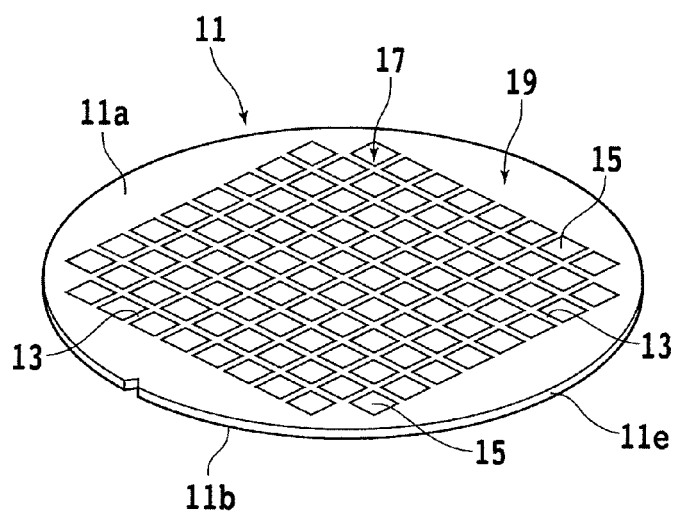
FIG. 1A is a perspective view showing a configuration example of a wafer as an object of processing by a processing method according to a mode for carrying out the present invention.
Figure 1B:
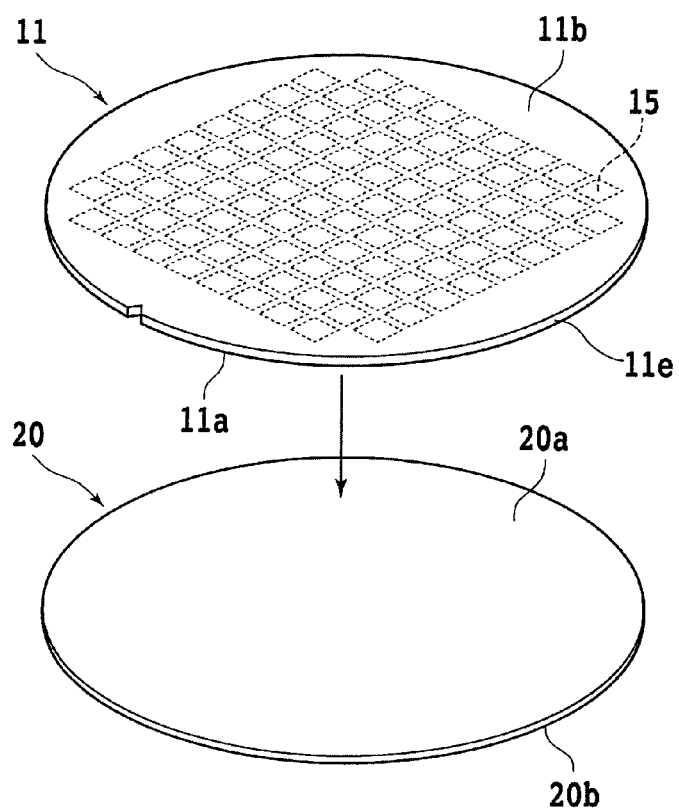
FIG. 1B is a perspective view showing a positioning step.

FIG. 1A is a perspective view showing a configuration example of a wafer as the object to be processed by the processing method according to the present mode, and FIG. 1B is a perspective view showing the positioning step in the processing method. As shown in FIG. 1A, the wafer (plate-shaped workpiece) 11 to be processed by the processing method in the present mode is a semiconductor wafer having a circular disk-like external shape, and has a central device region 17 and the outer peripheral marginal region 19 surrounding the device region 17. The device region 17 on the side of a front surface 11a of the wafer 11 is sectioned into a plurality of regions by streets (planned dividing lines) 13 arranged in a grid pattern, and a device 15 such as IC is formed in each of the plurality of regions. An outer circumference (side surface) 11e of the wafer 11 is chamfered to be arcuate in sectional shape (see FIGS. 2A to 2C, etc.).

In the processing method according to the present mode, first, the positioning step of mounting the wafer 11 on the support plate 20 is conducted. As shown in FIG. 1B, the support plate 20 is formed in a circular disk-like shape having an outside diameter equal to that of the wafer 11. The support plate 20 has rigidity necessary for supporting the wafer 11. In addition, the support plate 20 has a front surface 20a and a back surface 20b which are sufficiently flat. As the support plate 20, a semiconductor wafer which is the same as or similar to the wafer 11 can be used. For instance, in the case where the wafer 11 is a silicon wafer, the support plate 20 can also be a silicon wafer. Where the wafer 11 and the support plate 20 are thus formed from a common material, appropriate fusion bonding between the wafer 11 and the support plate 20 in the later joining step can be performed, without any considerable increase in processing cost. It is to be noted here, however, that the configuration of the support plate 20 is not limited to the just-mentioned. Any rigid material plate that has flat front and back surfaces and that permits appropriate fusion bonding between itself and the wafer 11 in the later joining step can be used as the support plate 20. For example, a glass substrate and the like may be used as the support plate 20.

In the positioning step, the above-mentioned wafer 11 is positioned over the support plate 20 in such a manner that the front surface 11a side of the wafer 11 and the front surface 20a side of the support plate 20 face each other. Then, the wafer 11 and the support plate 20 are brought closer to each other, and the wafer 11 is mounted on the support plate 20. Thus, upon completion of the positioning step, the front surface 11a of the wafer 11 and the front surface 20a of the support plate 20 are in contact with each other.

Figure 2A:
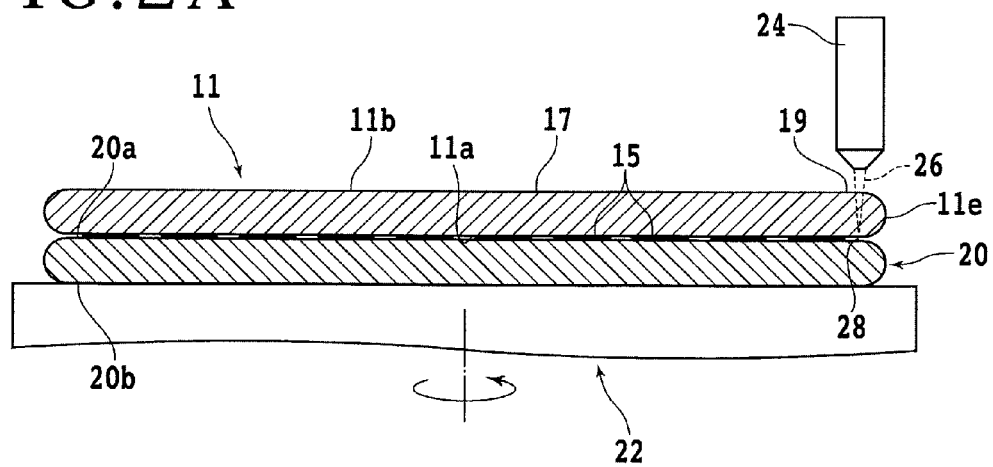
FIGS. 2A and 2B are partly sectional side views showing schematically a first embodiment of a joining step.
Figure 2B:
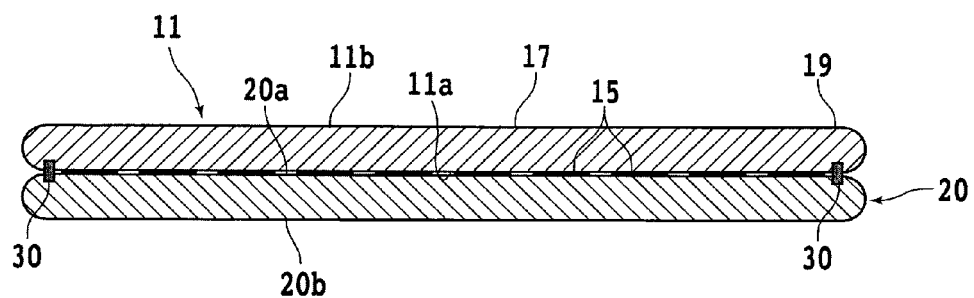
Figure 2C:
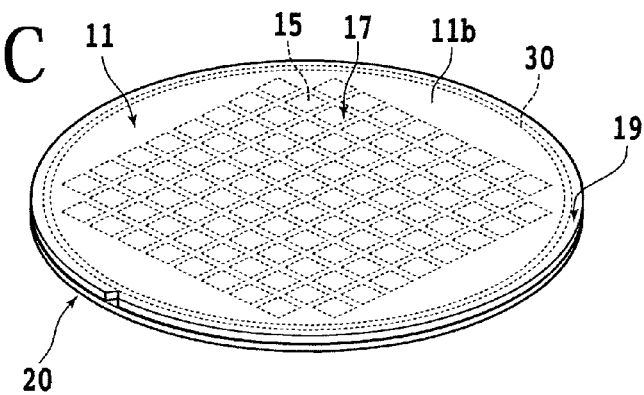
FIG. 2C is a perspective view of a wafer after the joining step according to the first embodiment.

After the positioning step, the joining step for fixing the wafer 11 to the support plate 20 is carried out. FIGS. 2A and 2B are partly sectional side views showing schematically the joining step in the processing method according to the present mode, and FIG. 2C is a perspective view of the wafer after the joining step is carried out. To the joining step, a second embodiment of the joining step which will be described later can also be applied in place of a first embodiment of the joining step shown in FIGS. 2A and 2B.

As shown in FIG. 2A, in the joining step, first, the back surface 20b side of the support plate 20 is suction held onto a chuck table 22 while maintaining a positional relationship of the wafer 11 and the support plate 20. Next, a laser beam processing head 24 is positioned over the outer peripheral marginal region 19 of the wafer 11, and the laser beam 26 is radiated toward the wafer 11 while rotating the chuck table 22.

The laser beam 26 is oscillated by using, for example, YAG, YVO4, Er/Yb/Tm-doped fiber or the like as a laser medium, and is radiated to the back surface 11b, which is an exposed surface of the wafer 11. In addition, a condensing point 28 of the laser beam 26 is positioned in the vicinity of an interface between the wafer 11 and the support plate 20 (specifically, between the front surface 11a and the front surface 20a). An optical system for condensing the laser beam 26 is preferably one that permits a long focal distance. The wavelength of the laser beam 26 is not specifically limited. Preferably, however, such a wavelength as to ensure that the laser beam 26 is not easily absorbed in the wafer 11 is used. For instance, where a silicon wafer is used as the wafer 11, a laser beam 26 having a wavelength in the infrared region (for example, a wavelength longer than 700 nm) is used. When the laser beam 26 has such a wavelength, absorption of the laser beam 26 in the inside of the wafer 11 can be restrained, whereby a laser beam 26 with a sufficient intensity can be made to reach the vicinity of the interface between the wafer 11 and the support plate 20.

As shown in FIGS. 2B and 2C, when the laser beam 26 with a sufficient intensity is radiated to the vicinity of the interface between the wafer 11 and the support plate 20, part of the wafer 11 on the front surface 11a side and part of the support plate 20 on the front surface 20a side are melted. As a result, a fusion bond region 30 where the wafer 11 and the support plate 20 are fusion-bonded to each other is formed in the outer peripheral marginal region 19 of the wafer 11, whereby the wafer 11 is fixed onto the support plate 20 through the fusion bond region 30. In this joining step, the irradiation with the laser beam 26 is conducted while rotating the chuck table 22, so that the fusion bond region 30 is formed in a circular annular shape surrounding the device region 17. It should be noted here, however, that the formation of the fusion bond region 30 and the like are not restricted to the just-mentioned. It suffices for the fusion bond region 30 to be formed in such a manner that the wafer 11 and the support plate 20 are fusion-bonded to each other, at least in the outer peripheral marginal region 19.

After the joining step, the processing step of processing the wafer 11 fixed on the support plate 20 is carried out. FIG. 3 is a partly sectional side view showing schematically the processing step in the processing method according to the present mode. In this mode, a grinding step is illustrated as an example of the processing step. As shown in FIG. 3, in the processing step (grinding step), the back surface 20b side of the support plate 20 is suction held onto the chuck table 32, and grindstones 36 of a grinding wheel 34 are put in contact with the back surface 11b of the wafer 11. In this condition, the chuck table 32 and the grinding wheel 34 are put into relative rotation, whereby the back surface 11b side of the wafer 11 is ground.

In the processing method according to the present mode, the wafer 11 is fixed on the support plate 20 in the joining step, without using a glue layer or an adhesive; therefore, scattering of the height position of the back surface 11b, as the object surface to be processed, of the wafer 11 can be restrained sufficiently. Consequently, the finished thickness of the wafer 11 upon the grinding step can be made uniform.

Incidentally, a processing step other than the grinding step may also be performed. For instance, a TSV forming step for forming a TSV (through-silicon via), a laser beam processing step for forming a modified layer in the inside of the wafer 11, or the like can be conducted in place of the grinding step. In addition to the grinding step, a TSV forming step, a laser beam processing step or the like may be carried out.

After the processing step, the detaching step of detaching the wafer 11 from the support plate 20 is performed. FIGS. 4A and 4B are partly sectional side views showing schematically the detaching step in the processing method according to the present mode. To the detaching step, there can be applied a second embodiment, a third embodiment or a fourth embodiment of detaching step (which will be described later), in place of a first embodiment of detaching step shown in FIGS. 4A and 4B.

In the detaching step, as shown in FIG. 4A, first, the back surface 20b side of the support plate 20 is suction held onto a chuck table 38. Then, a cutting blade 40 rotated at a high speed is positioned on the inner side of the fusion bond region 30, and is driven into the back surface 11b side of the wafer 11; in this condition, the chuck table 38 is rotated. The driving-in depth of the cutting blade 40 is set to be not less than the thickness of the wafer 11 having undergone the processing step. As a result, a splitting groove 42 in such a depth as to reach the support plate 20 is formed. The cutting blade 40 is positioned at least in such a manner that the inner circumference of the splitting groove 42 is formed on the side of the center of the wafer 11 relative to the inner circumference of the fusion bond region 30.

With the splitting groove 42 as a boundary, the wafer 11 is split into a portion on the central side (the device region 17 side) and a portion on the outer circumference side (the outer peripheral marginal region 19 side). Therefore, the wafer portion on the device region 17 side of the wafer 11 can be easily detached from the support plate 20, as shown in FIG. 4B.

In the processing method according to the present mode, the wafer 11 is fixed onto the support plate 20 in the joining step, without using any glue layer or adhesive; therefore, remaining of a glue or adhesive on the wafer 11 upon the detaching step can be prevented.

As has been described above, in the processing method according to this mode for carrying out the present invention, the wafer 11 and the support plate 20 are fusion-bonded to each other through irradiation with the laser beam 26, whereby the wafer 11 can be fixed onto the support plate 20 without using any glue layer or adhesive. Therefore, the height position of the back surface 11b, as the object surface to be processed, of the wafer 11 can be restrained from scattering due to the use of a glue layer or adhesive. Besides, remaining of a glue or adhesive on the wafer 11 can be prevented.

Figure 5A:
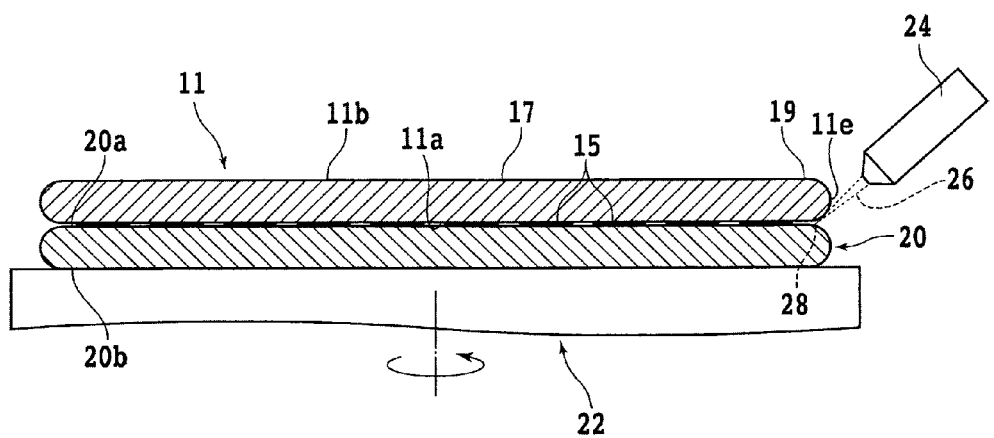
FIGS. 5A and 5B are partly sectional side views showing schematically a second embodiment of the joining step.
Figure 5B:
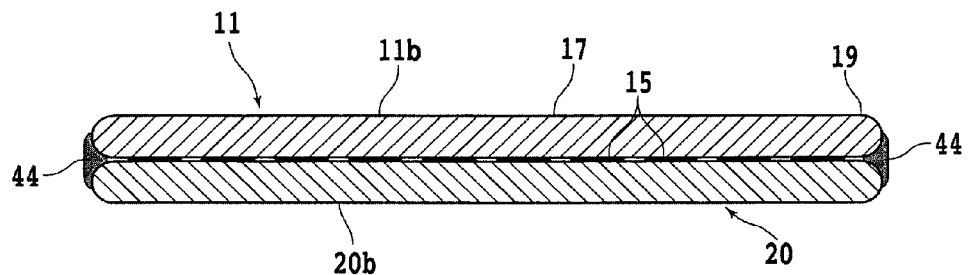
Figure 5C:
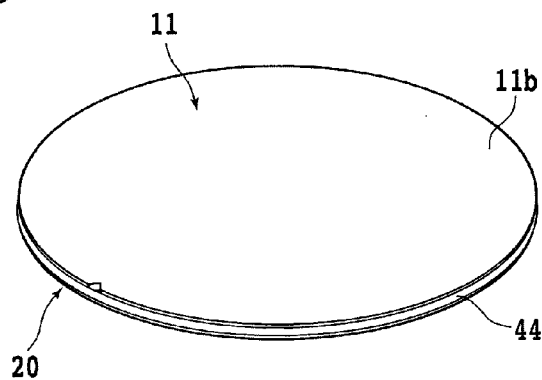
FIG. 5C is a perspective view of a wafer after the joining step according to the second embodiment.

Incidentally, the joining step or the detaching step in the present mode as described above can be modified to other embodiment. FIGS. 5A and 5B are partly sectional side views showing schematically a second embodiment of the joining step, and FIG. 5C is a perspective view of a wafer after the joining step according to the second embodiment is conducted. FIGS. 6A and 6B, FIGS. 7A and 7B, and FIGS. 8A and 8B are partly sectional side views showing schematically a second embodiment, a third embodiment, and a fourth embodiment of detaching step, respectively.

In the second embodiment of the joining step, as shown in FIG. 5A, the back surface 20b side of the support plate 20 is suction held onto the chuck table 22, after which the laser beam processing head 24 is positioned on the outer side of the outer circumference 11e of the wafer 11. Then, irradiation with the laser beam 26 is conducted while rotating the chuck table 22. The laser beam 26 is oscillated by using, for example, YAG, YVO4, Er/Yb/Tm-doped fiber or the like as a laser medium, and is radiated toward the interface between the wafer 11 and the support plate 20 from a lateral side of the wafer 11. The condensing point 28 of the laser beam 26 is positioned in the vicinity of the interface between the wafer 11 and the support plate 20.

As shown in FIGS. 5B and 5C, when the laser beam 26 with a sufficient intensity is radiated to the vicinity of the interface between the wafer 11 and the support plate 20, part of the wafer 11 on the front surface 11a side and part of the support plate 20 on the front surface 20a side are melted. As a result, a fusion bond region 44 where the wafer 11 and the support plate 20 are fusion-bonded to each other is formed in the outer peripheral marginal region 19 of the wafer 11. Consequently, the wafer 11 is fixed onto the support plate 20 through the fusion bond region 44.

Figure 6A:
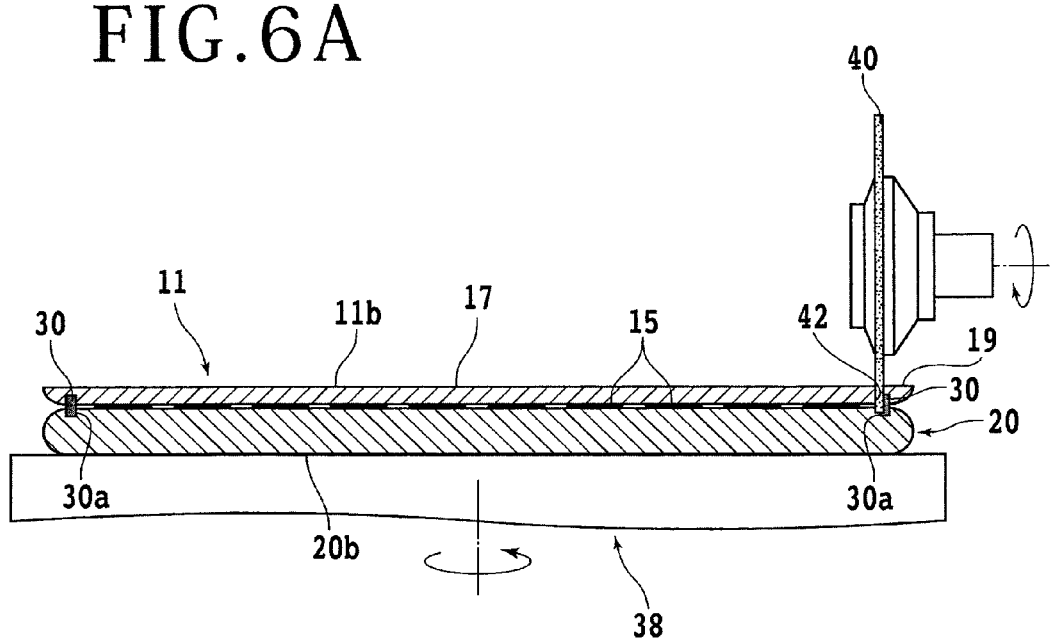
FIGS. 6A and 6B are partly sectional side views showing schematically a second embodiment of the detaching step.
Figure 6B:
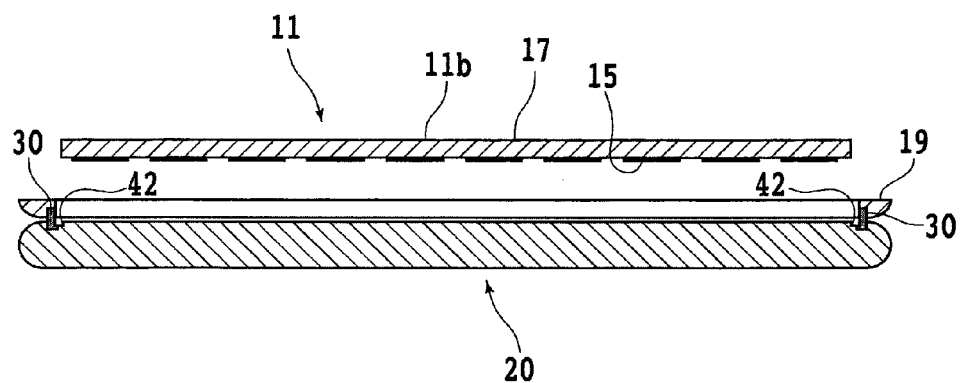

In the second embodiment of detaching step, as shown in FIG. 6A, the back surface 20b side of the support plate 20 is suction held onto the chuck table 38. Then, the cutting blade 40 rotated at a high speed is positioned so as to overlap with an inner-side edge 30a of the fusion bond region 30, and is driven into the back surface 11b side of the wafer 11; in this condition, the chuck table 38 is rotated. The driving-in depth of the cutting blade 40 is set to be not less than the thickness of the wafer 11 having undergone the processing step. As a result, a splitting groove 42 in such a depth as to reach the support plate 20 is formed. With the splitting groove 42 as a boundary, the wafer 11 is split into a portion on the central side and a portion on the outer circumference side. Consequently, the portion of the wafer 11 on the device region 17 side can be easily detached from the support plate 20, as shown in FIG. 6B.

Figure 7A:
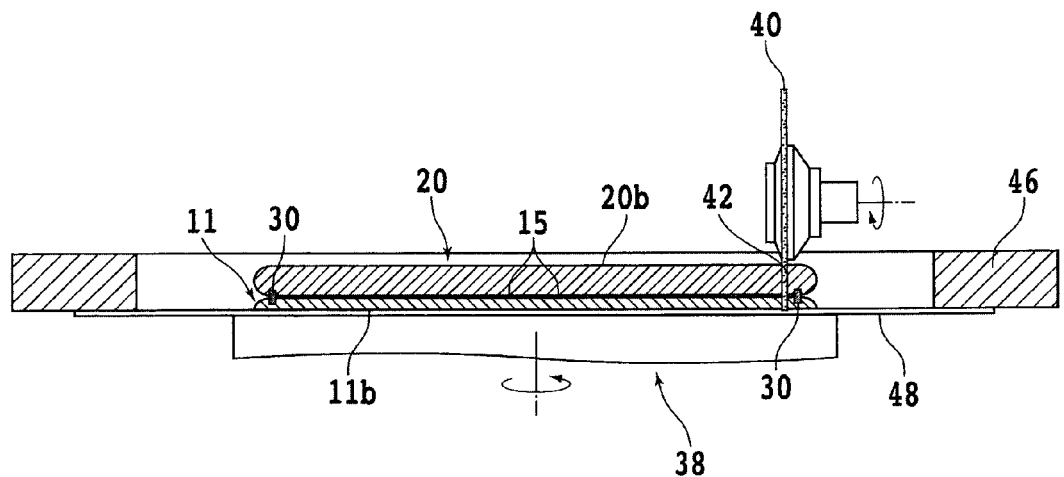
FIGS. 7A and 7B are partly sectional side views showing schematically a third embodiment of the detaching step.

In the third embodiment of detaching step, as shown in FIG. 7A, first, a dicing tape 48 set on a circular annular frame 46 is adhered to the back surface 11b side of the wafer 11 fixed on the support plate 20. The back surface lib side of the wafer 11 is suction held onto the chuck table 38 through the dicing tape 48, after which the chuck table 38 is rotated. Then, the cutting blade 40 rotated at a high speed is positioned on the inner side of the fusion bond region 30, and is driven into the back surface 20b side of the support plate 20.

The driving-in depth of the cutting blade 40 is set to be not less than the sum of the thickness of the support plate 20 and the thickness of the wafer 11 having undergone the processing step. This results in that a splitting groove 42 in such a depth as to reach the dicing tape 48 is formed. The cutting blade 40 is positioned at least in such a manner that the inner circumference of the splitting groove 42 is formed on the side of the center of the wafer 11 relative to the inner circumference of the fusion bond region 30.

Figure 7B:
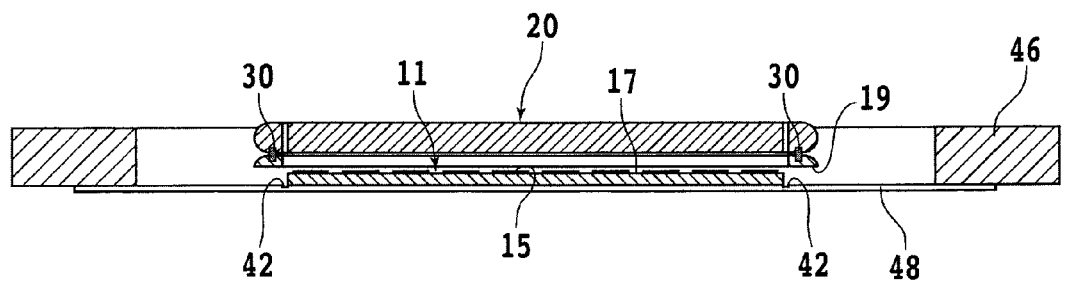

With the splitting groove 42 as a boundary, the wafer 11 is split into a portion on the central side and a portion on the outer circumference side. Therefore, the portion of the wafer 11 on the device region 17 side can be easily detached from the support plate 20, as shown in FIG. 7B. In the third embodiment of detaching step, the wafer 11 detached from the support plate 20 is supported by the dicing tape 48 and the frame 46, so that the risk of breakage of the wafer 11 during handling thereof can be lowered.

Figure 8A:
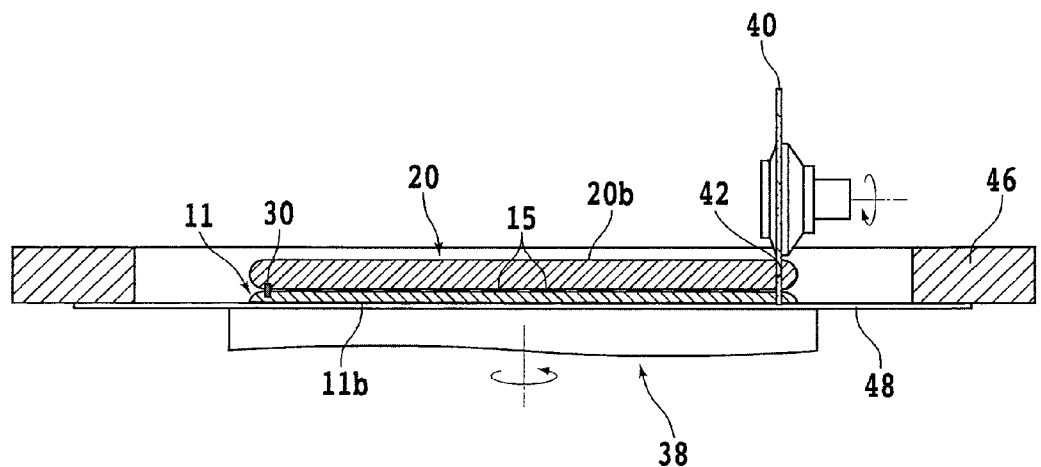
FIGS. 8A and 8B are partly sectional side views showing schematically a fourth embodiment of the detaching step.

In the fourth embodiment of detaching step, as shown in FIG. 8A, first, a dicing tape 48 set on a circular annular frame 46 is adhered to the back surface 11b side of the wafer 11 fixed on the support plate 20. The back surface 11b side of the wafer 11 is suction held onto the chuck table 38 through the dicing tape 48, after which the chuck table 38 is rotated. Then, the cutting blade 40 rotated at a high speed is positioned so as to overlap with the fusion bond region 30, and is driven into the back surface 20b side of the support plate 20.

Figure 8B:
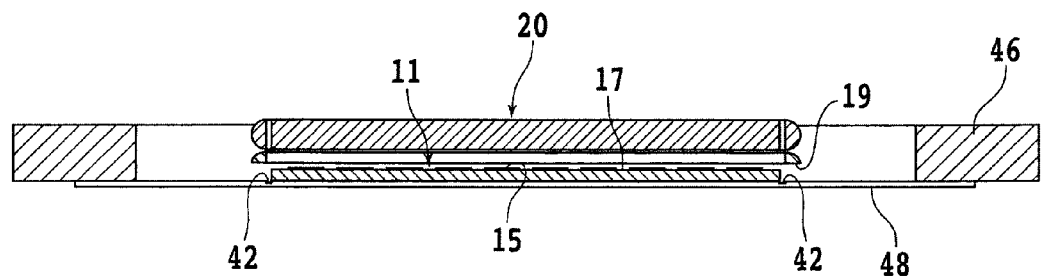

The driving-in depth of the cutting blade 40 is set to be not less than the sum of the thickness of the support plate 20 and the thickness of the wafer 11 having undergone the processing step. As a result, a splitting groove 42 in such a depth as to reach the dicing tape 48 is formed. Therefore, the portion of the wafer 11 on the device region 17 side can be easily detached from the support plate 20, as illustrated in FIG. 8B.

In the fourth embodiment of detaching step, like in the third embodiment of detaching step, the wafer 11 detached from the support plate 20 is supported by the dicing tape 48 and the frame 46, so that the risk of breakage of the wafer 11 during handling thereof can be lowered.

The present invention is not limited to the embodiments described above, and can be carried out with various modifications. For instance, while the detaching step for detaching the wafer 11 from the support plate 20 by forming the splitting groove 42 by use of the cutting blade 40 has been described in the above embodiments, the splitting groove 42 may be formed by ablation through irradiation with a laser beam.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of processing a plate-shaped workpiece, comprising:
    a positioning step of mounting the plate-shaped workpiece on a support plate;
    a joining step of irradiating an outer peripheral portion of the plate-shaped workpiece mounted on the support plate with a laser beam to form a fusion bond region where the plate-shaped workpiece is fusion-bonded to the support plate at the outer peripheral portion of the plate-shaped workpiece, thereby fixing the plate-shaped workpiece onto the support plate; and
    a processing step of processing the plate-shaped workpiece after the joining step.

2. The processing method according to claim 1, further comprising:
    a detaching step of forming, after the processing step, a splitting groove for splitting the plate-shaped workpiece along the fusion bond region, and detaching the plate-shaped workpiece from the support plate,
    wherein in the detaching step, the splitting groove is formed so that an inner circumference of the splitting groove is located on the side of a center of the plate-shaped workpiece relative to the position of an inner circumference of the fusion bond region.

3. The processing method according to claim 1, wherein in the joining step, the plate-shaped workpiece mounted on the support plate is irradiated with the laser beam from an exposed surface of the plate-shaped workpiece while positioning a condensing point of the laser beam at an interface between the plate-shaped workpiece and the support plate, thereby forming the fusion bond region on an inner side of an outer circumferential edge of the plate-shaped workpiece.

4. The processing method according to claim 1, wherein the fusion bond region is a region including a side surface of the plate-shaped workpiece mounted on the support plate.

\* \* \* \* \*